(12) United States Patent
Nagata

(10) Patent No.: US 6,261,860 B1
(45) Date of Patent: Jul. 17, 2001

(54) METHOD OF FABRICATING SOLID-STATE IMAGE SENSOR

(75) Inventor: Tsuyoshi Nagata, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/281,284

(22) Filed: Mar. 30, 1999

(30) Foreign Application Priority Data

Apr. 1, 1998 (JP) .................................................. 10-088612

(51) Int. Cl.[7] .................................................. H01L 21/00
(52) U.S. Cl. .................................................. 438/58
(58) Field of Search .................. 438/48, 58, 143, 438/471, 477

(56) References Cited

U.S. PATENT DOCUMENTS

| | | | |
|---|---|---|---|
| 4,376,657 | * 3/1983 | Nagasawa et al. | 438/402 |
| 4,622,082 | * 11/1986 | Dyson et al. | 438/471 |
| 5,286,658 | * 2/1994 | Shirakawa et al. | 438/5 |
| 5,674,756 | * 10/1997 | Satoh et al. | 438/471 |
| 5,734,195 | * 3/1998 | Takizawa et al. | 257/607 |

FOREIGN PATENT DOCUMENTS

| | | |
|---|---|---|
| 7-35329 | 2/1982 | (JP) . |
| 1-242500 | 9/1989 | (JP) . |
| 4-43646 | 2/1992 | (JP) . |
| 5-74782 | 3/1993 | (JP) . |
| 9-199379 | 7/1997 | (JP) . |

* cited by examiner

*Primary Examiner*—Charles Bowers
*Assistant Examiner*—Keith Christianson
(74) *Attorney, Agent, or Firm*—McGinn & Gibb, PLLC

(57) ABSTRACT

There is provided a method of fabricating a solid-state image sensor, comprising the step of carrying out heat treatment before formation of a gate of the solid-state image sensor, a maximum temperature in the heat treatment being in the range of 1000 to 1200 degrees centigrade both inclusive, the step of carrying out heat treatment further including the steps of (a) carrying out lamp-up at least twice, and (b) carrying out lamp-down at least twice. The method makes it possible to grow BMD (Bulk-Micro-Defect) in a wafer in a greater size than a size of BMD to be grown in accordance with a conventional method, ensuring reduction in illuminated or white defect.

25 Claims, 14 Drawing Sheets

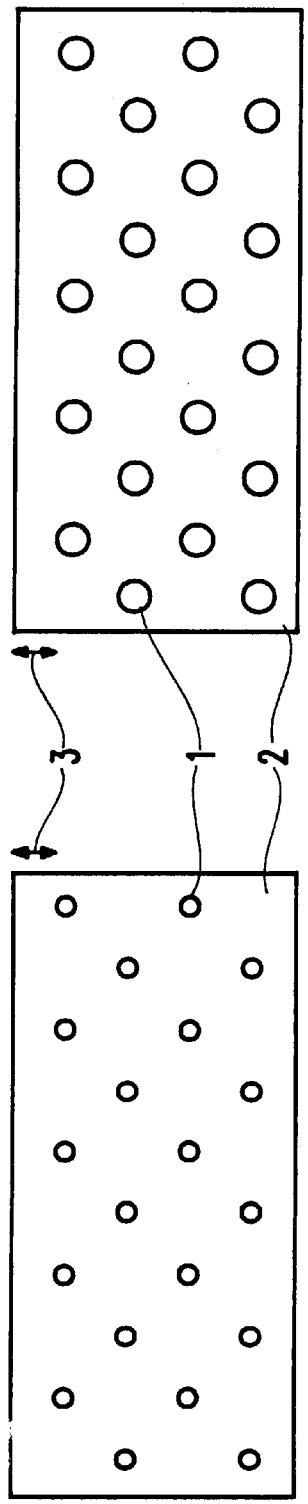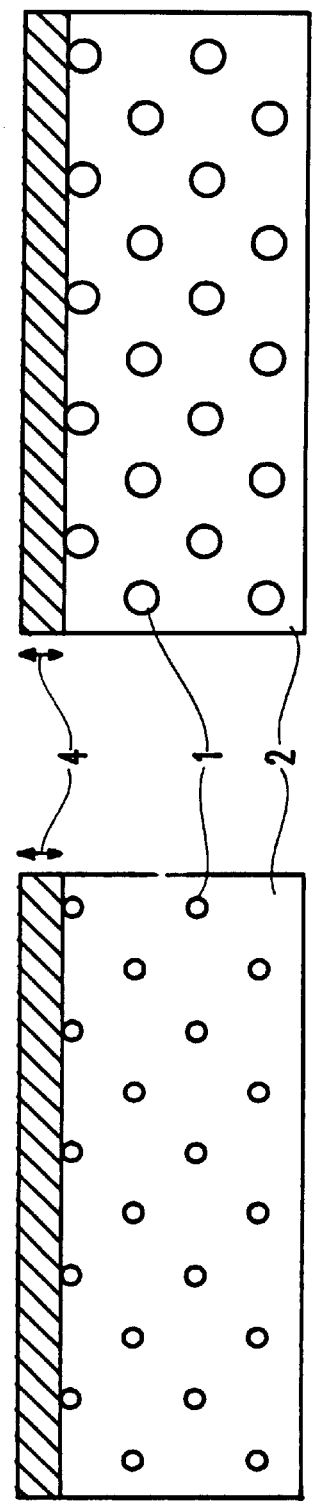

METHOD OF FABRICATING SOLID-STATE IMAGE SENSOR

BACKGROUND OF THE INVENTION

1. Field of the Invention

The invention relates to a method of fabricating a solid-state image sensor.

2. Description of the Related Art

Contaminants such as heavy metals may penetrate a wafer while a solid-state image sensor is being fabricated. In order to remove such contaminants out of a device active region, there is usually carried out gettering.

In one of gettering techniques, bulk-micro-defect (BMD) is formed in a wafer in an amount required for removing contaminants. That is, BMD is formed in heat treatment carried out in a process of fabricating a solid-state image sensor, and contaminants are gettered into the thus formed BMD. Accordingly, it is a key in gettering to form BMD in a wafer.

One of methods of forming BMD in a wafer includes the steps of slicing Cz (Czochralski-Zone)-Si ingot into wafers, polishing Si wafer at a surface thereof, carrying out first heat treatment at a temperature in the range of 1150 to 1200 degrees centigrade to thereby melt oxygen cores having been precipitated at a surface of a wafer, and externally diffuse oxygen from a surface of a wafer, and carrying out second heat treatment at a temperature in the range of 500 to 800 degrees centigrade to thereby form oxygen precipitation cores in a wafer.

In accordance with the above-mentioned method, oxygen precipitation cores are not formed at a surface of a wafer in the second heat treatment, since oxygen cores having been precipitated at a surface of a wafer is molten, and oxygen is externally diffused from a surface of a wafer in the first heat treatment. As a result, a wafer can have a non-defective layer at a surface thereof, and can contain oxygen precipitation cores therein.

After oxygen precipitation cores have been formed in a wafer in the above-mentioned way, the wafer is subject to heat treatment at a temperature in the range of 1000 to 1200 degrees centigrade to thereby cause oxygen to be precipitated out of oxygen precipitation cores. Thus, there is formed BMD.

However, the above-mentioned method of forming BMD is accompanied with a problem that a solid-state image sensor including a wafer fabricated in accordance with the above-mentioned method would have illuminated or white defects at a high level. This is considered because contaminants such as heavy metals which penetrate a wafer while a solid-state image sensor is being fabricated are insufficiently gettered into BMD in a wafer, and in particular, because BMD is insufficiently grown in a wafer.

Apart from the above-mentioned method, various gettering techniques have been suggested as follows in order to remove contaminants such as heavy metals out of a device active region.

For instance, Japanese Unexamined Patent Publication No. 57-35329 has suggested a method including the steps of precipitating oxygen atoms in a bulk at a temperature in the range of 1150 to 1200 degrees centigrade to thereby remove defects having been formed at a surface of a wafer, and growing oxygen precipitation at a temperature in the range of 1000 to 1100 degrees centigrade to thereby enhance gettering effect.

Japanese Unexamined Patent Publication No. 1-242500 has suggested a method including the steps of externally diffusing oxygen from a surface of a wafer at 1200 degrees centigrade to thereby diffuse silicon existing at a surface of a wafer, into a wafer, and cooling the wafer down to a temperature in the range of 500 to 800 degrees centigrade at a cooling rate of 1 to 10 degrees per minute, to thereby form oxygen cores in a bulk.

Japanese Unexamined Patent Publication No. 4-43646 has suggested a method of growing an epitaxial layer on a silicon substrate fabricated in accordance with Cz process, and carrying out both heat treatment at a relatively low temperature for a shorter period of time and heat treatment at a relatively high temperature for a longer period of time to thereby facilitate precipitation of oxygen in the Cz substrate.

Japanese Unexamined Patent Publication No. 5-74782 has suggested a method of carrying out intrinsic gettering by applying heat treatment at three stages to a silicon substrate sliced out of silicon monocrystal having been formed in accordance with Cz process. The first heat treatment is carried out at a temperature in the range of 1100 to 1150 degrees centigrade, the second heat treatment is carried out at a temperature equal to or higher than 1200 degrees centigrade, and the third treatment is carried out at a temperature lower than a temperature at which the first heat treatment was carried out.

Japanese Unexamined Patent Publication No. 9-199379 has taught that heat treatment to be carried out at a temperature in the range of 1000 to 1200 degrees centigrade is optimal for obtaining a high grade epitaxial wafer.

However, the inventor has analyzed the methods suggested in the above-mentioned Publications to thereby find out that it would be quite difficult or almost impossible to sufficiently grow BMD in a wafer even in accordance with the above-mentioned methods, and that it is not always possible to obtain desired gettering effect.

SUMMARY OF THE INVENTION

In view of the foregoing problem of the conventional methods, it is an object of the present invention to provide a method of fabricating a solid-state image sensor, which method is capable of growing BMD in a wafer in a greater size than a size of BMD grown in accordance with conventional methods to thereby ensure reduction in a level of illuminated or white defect in a solid-state image sensor, with a non-defective layer being kept as it is at a surface of a wafer.

There is provided a method of fabricating a solid-state image sensor, including the step of carrying out heat treatment before formation of a gate of the solid-state image sensor, a maximum temperature in the heat treatment being in the range of 1000 to 1200 degrees centigrade both inclusive, the step of carrying out heat treatment further including the steps of (a) carrying out lamp-up at least twice, and (b) carrying out lamp-down at least twice.

There is further provided a method of fabricating a solid-state image sensor, including the steps of carrying out first heat treatment at a temperature in the range of 1150 to 1200 degrees centigrade both inclusive, and carrying out second heat treatment at a temperature in the range of 500 to 800 degrees centigrade both inclusive, the first and second heat treatment both being to be carried out before formation of a gate of the solid-state image sensor, at least two lamp-up steps and at least two lamp-down steps being carried out while the first and second heat treatment are carried out.

It is preferable that a temperature in the first lamp-up step is in the range of 1000 to 1200 degrees centigrade both inclusive, and the second or later lamp-up step has an upper limit temperature of 1200 degrees centigrade.

It is preferable that a lamp-down step to be carried out after a lamp-up step has a lower limit temperature of 1000 degrees centigrade.

Temperatures achieved in the lamp-up steps may be the same as each other, but it is preferable that temperatures achieved in the lamp-up steps are different from each other.

Likewise, temperatures achieved in the lamp-down steps may be the same as each other, but it is preferable that temperatures achieved in the lamp-down steps are different from each other.

For instance, a lamp-up rate in the lamp-up steps may be designed to be in the range of 8 to 200 degrees per minute. Likewise, a lamp-down rate in the lamp-down steps may be designed to be in the range of 3 to 100 degrees per minute.

The number of the lamp-up steps is not always necessary to be the same as the number of the lamp-down steps. The number of the lamp-up steps may be greater than the number of the lamp-down steps, and vice versa. However, it is preferable that the number of the lamp-up steps is the same as the number of the lamp-down steps.

There is further provided a method of fabricating a solid-state image sensor, including the steps of (a) forming an epitaxial layer on a substrate, and (b) fabricating a solid-state image sensor on the epitaxial layer in accordance with one of the above-mentioned methods.

As mentioned above, in accordance with the method, at least two lamp-up steps and at least two lamp-down steps are carried out in heat treatment to be carried out at a temperature in the range of 1000 to 1200 degrees centigrade. The method makes it possible to grow BMD in a wafer in a greater size than a size of BMD grown in accordance with conventional methods, with a non-defective layer is kept as it is at a surface of a wafer, ensuring desired gettering effect. In other words, contaminants such as heavy metals penetrating a wafer while a solid-state image sensor is being fabricated are gettered to a greater degree into BMD having been grown in a wafer, than conventional methods, which ensures reduction in a level of illuminated or white defect in a resultant solid-state image sensor.

The lamp-up steps and the lamp-down steps both to be carried out at least twice are designed to pass a temperature band most suitable for BMD growth by the same number and for almost the same period of time for every one of products. Hence, it is ensured that there is not dispersion in a fabrication yield of a solid-state image sensor.

The gettering effect as mentioned above can be obtained in a wafer including Cz wafer as an underlying substrate, and an epitaxial wafer formed on the Cz wafer, as well as in Cz wafer.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 2 is a cross-sectional view of a solid-state image sensor, wherein (A) is a cross-sectional view of a solid-state image sensor formed on Cz wafer in accordance with a conventional method, and (B) is a cross-sectional view of a solid-state image sensor formed on Cz wafer in accordance with the present invention.

FIG. 3 is a cross-sectional view of a solid-state image sensor, wherein (A) is a cross-sectional view of a solid-state image sensor formed on an epitaxial wafer in accordance with a conventional method, and (B) is a cross-sectional view of a solid-state image sensor formed on an epitaxial wafer in accordance with the present invention.

DESCRIPTION OF THE PREFERRED EMBODIMENTS

Figure 1:
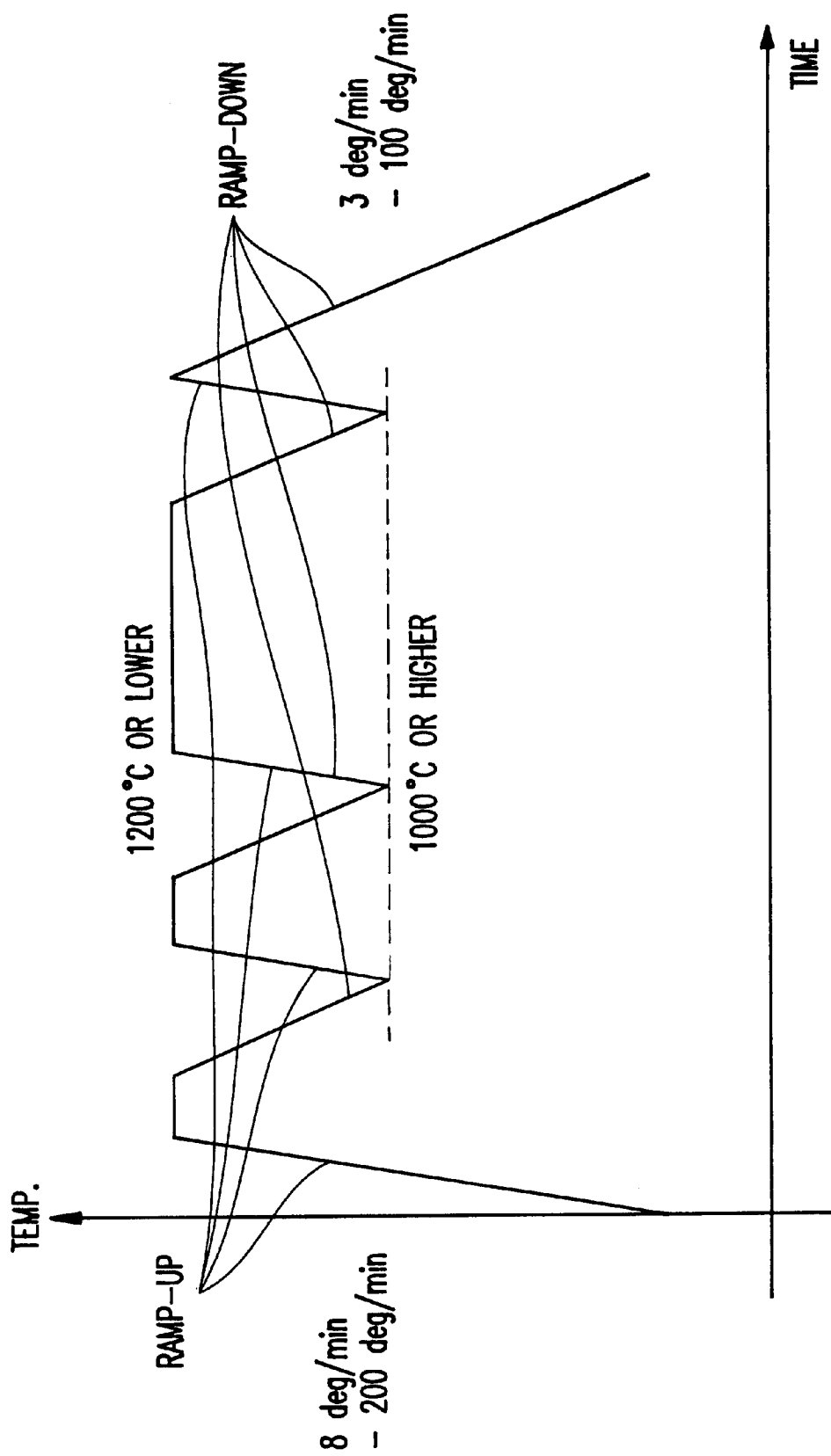
FIG. 1 is a graph illustrating a relation between a temperature and lapse of time in heat treatment to be carried out in an embodiment in accordance with the present invention.

FIG. 1 is a graph illustrating a relation between a temperature and lapse of time in heat treatment to be carried out in an embodiment in accordance with the present invention.

In this heat treatment, a maximum temperature in fabrication steps to be carried out before formation of a gate of a solid-state image sensor is in the range of 1000 to 1200 degrees centigrade both inclusive. As illustrated in FIG. 1, lamp-up steps are carried out four times, and lamp-down steps are carried out four times in the heat treatment.

An upper limit temperature in the lamp-up steps is designed to be 1200 degrees centigrade. A lamp-up rate is designed to be in the range of 8 to 200 degrees per minute. A lower limit temperature in the lamp-down steps is designed to be 1000 degrees centigrade. A lamp-down rate is designed to be in the range of 3 to 100 degrees per minute.

The reason why the upper and lower limit temperatures are determined to be the above-mentioned values is that BMD grows most effectively at a temperature in the range of 1000 to 1200 degrees centigrade.

The reason why the lamp-up and lamp-down rates are determined to be the above-mentioned values is as follows.

The lamp-up rate of 8 degrees per minute is a maximum rate which can be controlled by an existing core tube. If a lamp-up rate is designed to be greater, it would be possible to increase the number of lamp-down and lamp-up steps after a furnace temperature has reached a maximum temperature, which would ensure effective BMD growth.

If a lamp-up rate is greater than 200 degrees per minute, there might occur slipping in a wafer in a lamp-annealing furnace. Hence, a lamp-up rate is preferably equal to or smaller than 200 degrees per minute.

The lamp-down rate of 3 degrees per minute is a maximum quenching rate which can be controlled in a core tube. If a lamp-down rate is designed to be greater than 100 degrees per minute, a wafer would be curved more than allowed, which would cause a hindrance in subsequent fabrication of a solid-state image sensor. Hence, a lamp-down rate is preferable in the range of 3 to 100 degrees per minute.

The embodiment in which lamp-up and lamp-down steps are carried out both more than twice facilitates BMD growth in a wafer to a degree required for carrying out gettering, in comparison with the conventional methods. Herein is explained this advantage with reference to FIGS. 2 and 3.

FIG. 2(A) is a cross-sectional view of a solid-state image sensor formed on Cz wafer in accordance with a conventional method, and FIG. 2(B) is a cross-sectional view of a solid-state image sensor formed on Cz wafer in accordance with the instant embodiment.

In both of the illustrated solid-state image sensors, a non-defective layer 3 is formed at a surface of Cz-Si wafer 2, and a plurality of BMDs 1 are formed in the Cz-Si wafer 2.

FIG. 3(A) is a cross-sectional view of a solid-state image sensor formed on Cz wafer on which an epitaxial wafer has been already formed, in accordance with a conventional method, and FIG. 3(B) is a cross-sectional view of a solid-state image sensor formed on Cz wafer on which an epitaxial wafer has been already formed, in accordance with the instant embodiment.

In both of the illustrated solid-state image sensors, a Si epitaxial layer 4 is formed at a surface of Cz-Si wafer 2, and a plurality of BMDs 1 are formed in the Cz-Si wafer 2.

The instant embodiment makes it possible to grow BMDs 1 in a wafer in a greater size than a size of BMD grown in accordance with conventional methods, as illustrated in FIGS. 2 and 3, by carrying out at least two lamp-up steps and at least two lamp-down steps in heat treatment which has a maximum temperature in the range of 1000 to 1200 degrees centigrade and which is to be carried out before formation of a gate of a solid-state image sensor. Hence, contaminants such as heavy metals penetrating a wafer while a solid-state image sensor is being fabricated can be gettered in a greater amount into BMDs 1 having been grown in the wafer 2, than conventional methods. This ensures reduction in a level of illuminated or white defect, and further, enhancement in electric characteristic in a resultant solid-state image sensor.

Some solid-state image sensors are subject to heat treatment at a temperature different from a temperature at which other solid-state image sensors are subject to heat treatment. Hence, even if an optimal temperature for activating ions having been implanted into a wafer before formation of a gate of a solid-state image sensor is commonly in the range of 1000 to 1200 degrees centigrade, an optimal temperature is dependent on a specific solid-state image sensor. For instance, an optimal temperature at which a first solid-state image sensor is subject to heat treatment is 1000 degrees centigrade, whereas an optimal temperature at which a second solid-state image sensor is subject to heat treatment is 1100 degrees centigrade.

Since the conventional methods do not include a lamping step in heat treatment having a maximum temperature in the range of 1000 to 1200 degrees centigrade, the maximum temperature has to be varied for every one of solid-state image sensors. This results in dispersion in a fabrication yield of a solid-state image sensor.

Figure 4:
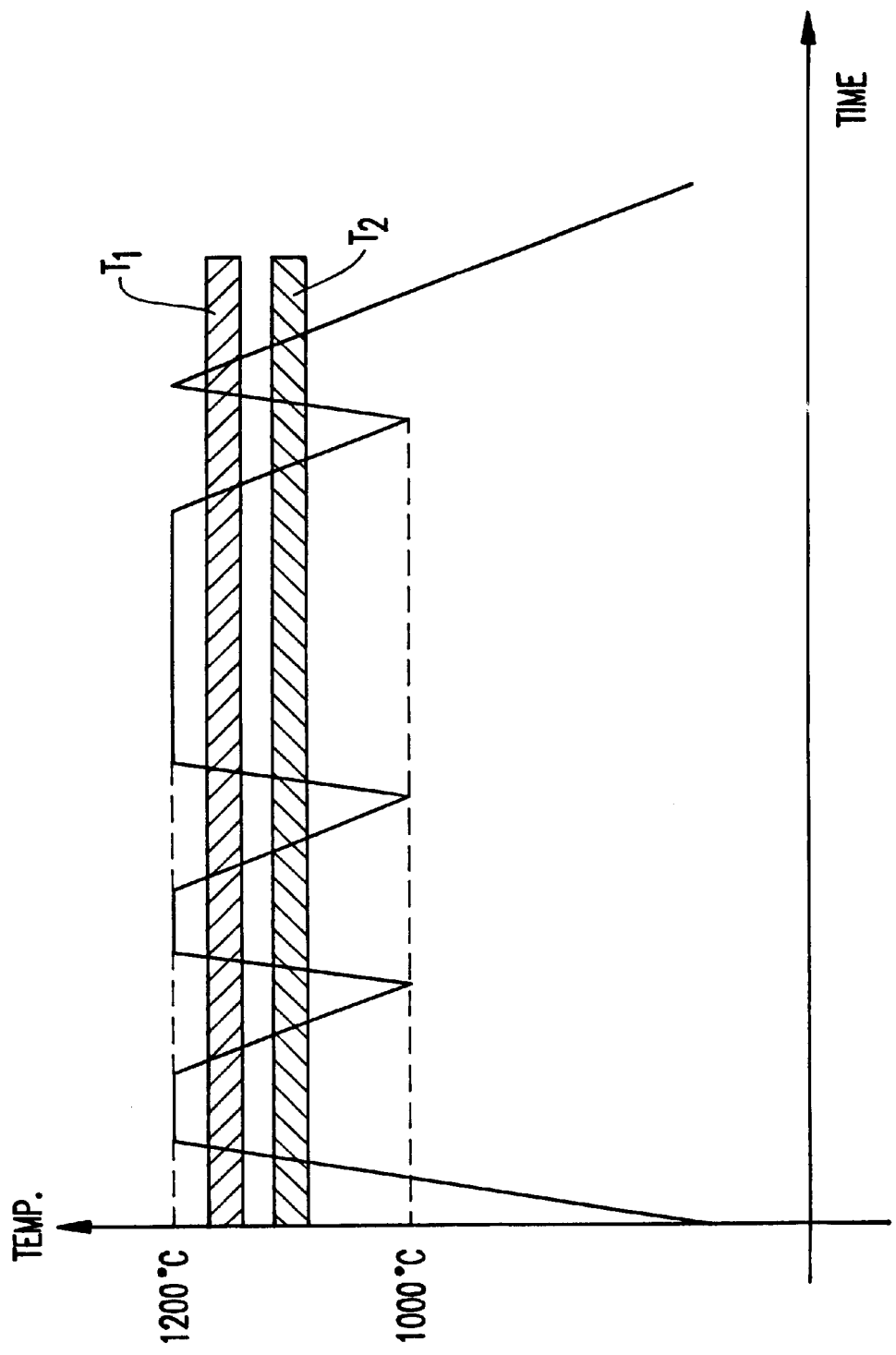
FIG. 4 is a graph illustrating a relation between a temperature and lapse of time in heat treatment to be carried out in an embodiment in accordance with the present invention, and further illustrates optimal temperature bands for ion activation to be carried out for a certain kind of a solid-state image sensor and another kind of a solid-state image sensor.

FIG. 4 is a graph illustrating a relation between a temperature and lapse of time in heat treatment to be carried out in the instant embodiment, and further illustrates an optimal temperature band T1 for activating ions implanted into a wafer of a certain kind of a solid-state image sensor, and an optimal temperature band T2 for activating ions implanted into a wafer of another kind of a solid-state image sensor.

The method in accordance with the instant embodiment carries out at least two lamp-up steps and at least two lamp-down steps in heat treatment in which a maximum temperature is in the range of 1000 to 1200 degrees centigrade and which is to be carried out before formation of a gate of a solid-state image sensor. As is obvious in view of FIG. 4, those lamp-up and lamp-down steps pass through the two optimal temperature bands T1 and T2 for almost the same period of time and by the same number. Thus, the instant embodiment carries out the lamp-up and lamp-down steps at a temperature optimal for BMD growth for almost the same period of time and by the same number for every one of solid-state image sensors. As a result, the instant embodiment provides an advantage that there is no longer dispersion in a fabrication yield of a solid-state image sensor.

Hereinbelow are explained examples of the embodiment in accordance with the present invention.

FIRST EXAMPLE

Hereinbelow is explained the first example with reference to FIGS. 5 to 8. FIGS. 5 to 8 illustrate how a temperature varies with the lapse of time in heat treatment which has a maximum temperature of 1200 degrees centigrade and which is to be carried out prior to formation of a gate of a solid-state image sensor. Heat treatment was carried out four times in such a manner as illustrated in FIGS. 5 to 8 to thereby fabricate four solid-state image sensors. The heat treatment illustrated in FIG. 5 was carried out in accordance with a conventional method, and the heat treatment illustrated in FIGS. 6 to 8 were carried out in accordance with the first example.

The heat treatment illustrated in FIGS. 5 to 8 were carried out in nitrogen atmosphere. A temperature of a furnace at which a wafer was introduced thereinto and a wafer was taken out thereof was set at 800 degrees centigrade, and lamp-up and lamp-down rates were set at 8 degrees per minute and 3 degrees per minute, respectively.

Figure 5:
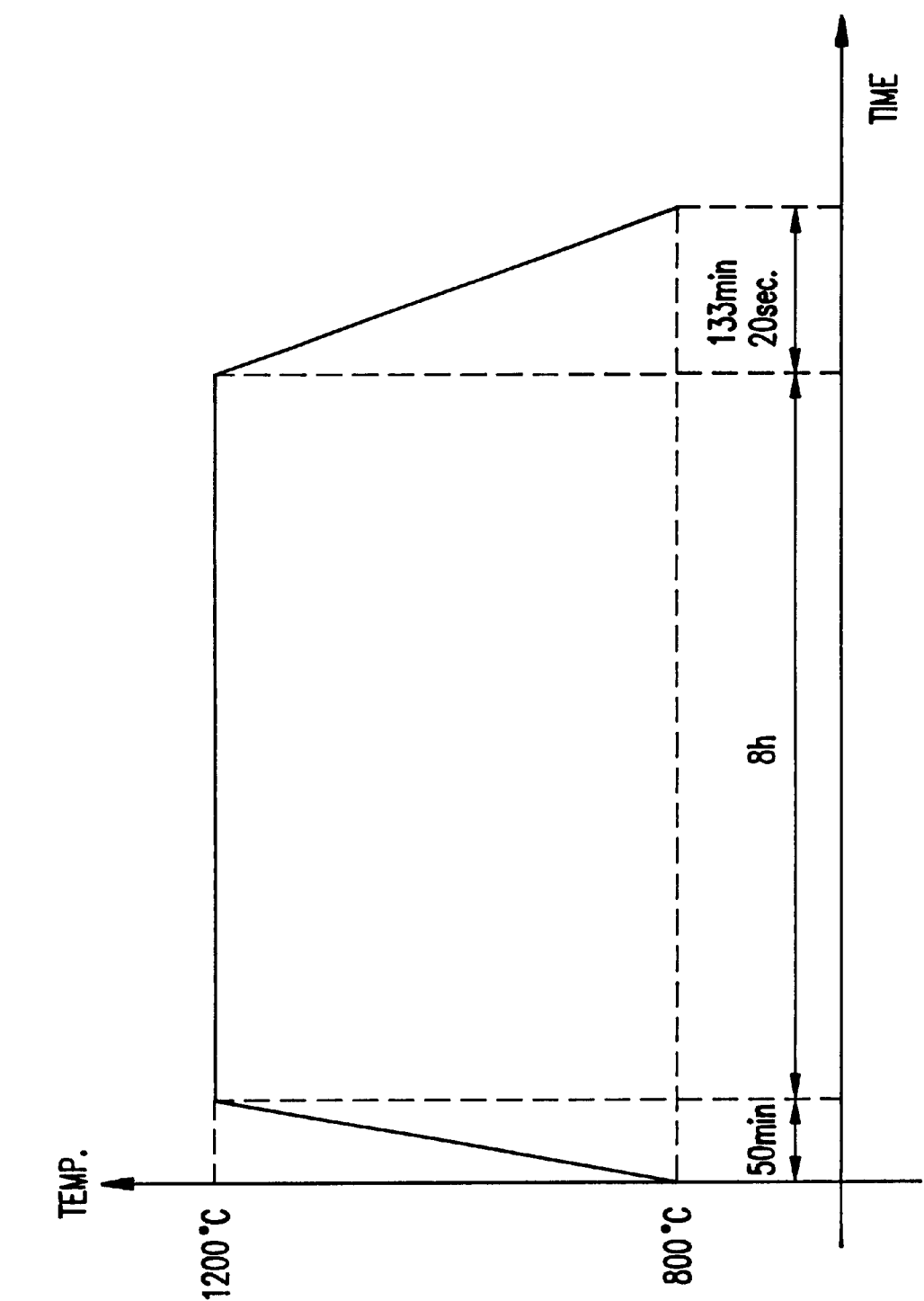
FIG. 5 is a graph illustrating a relation between a temperature in a furnace and lapse of time in heat treatment which has a maximum temperature of 1200 degrees centigrade and includes one lamp-up step and one lamp-down step both to be carried out before formation of a gate of a solid-state image sensor.

FIG. 5 illustrates a temperature varying with the lapse of time in heat treatment carried out in accordance with a conventional method. In this heat treatment, a lamp-up step was carried out only once, and a lamp-down step was carried out only once, too. The lamp-up step was carried out for 50 minutes. After a temperature was maintained at a maximum temperature of 1200 degrees centigrade for 8 hours, the lamp-down step was carried out for 133 minutes and 20 seconds.

Figure 6:
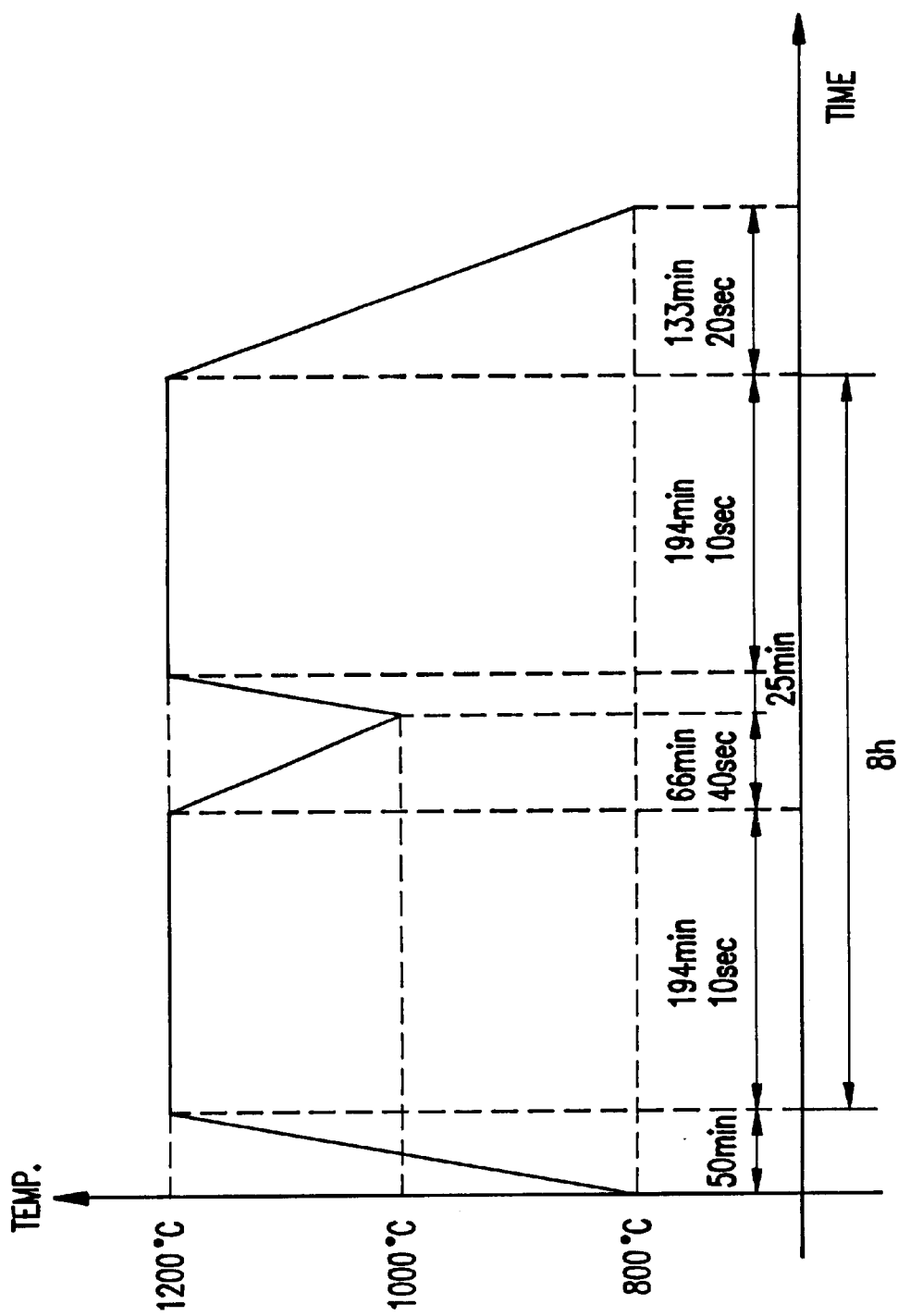
FIG. 6 is a graph illustrating a relation between a temperature in a furnace and lapse of time in heat treatment to be carried out in a method in accordance with the first example of the present invention. In this heat treatment, lamp-up and lamp-down steps are both carried out twice.

FIG. 6 illustrates a temperature varying with the lapse of time in the first heat treatment carried out in accordance with the first example. In the first heat treatment, a lamp-up step was carried out twice, and a lamp-down step was carried out twice, too. The first lamp-up step was carried out for 50 minutes. After a temperature was maintained at a maximum temperature of 1200 degrees centigrade for 194 minutes and 10 seconds, the first lamp-down step was carried out for 66 minutes and 40 seconds. Then, the second lamp-up step was carried out for 25 minutes. After a temperature was maintained at a maximum temperature of 1200 degrees centigrade for 194 minutes and 10 seconds, the second lamp-down step was carried out for 133 minutes and 20 seconds.

Figure 7:
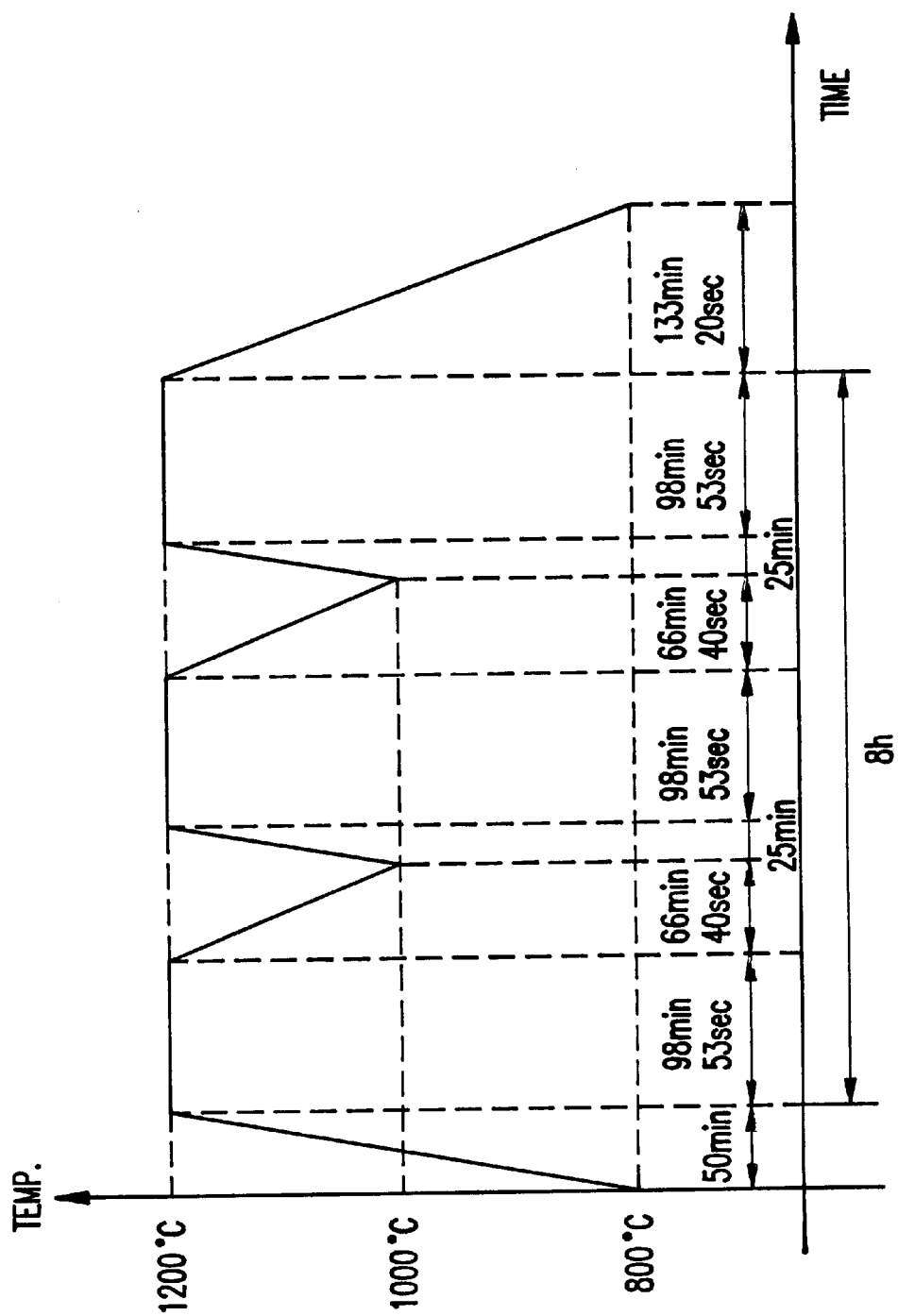
FIG. 7 is a graph illustrating a relation between a temperature in a furnace and lapse of time in heat treatment to be carried out in a method in accordance with the first example of the present invention. In this heat treatment, lamp-up and lamp-down steps are both carried out three times.

FIG. 7 illustrates a temperature varying with the lapse of time in the second heat treatment carried out in accordance with the first example. In the second heat treatment, a lamp-up step was carried out three times, and a lamp-down step was carried out three times, too. The first lamp-up step was carried out for 50 minutes. After a temperature was maintained at a maximum temperature of 1200 degrees centigrade for 98 minutes and 53 seconds, the first lamp-down step was carried out for 66 minutes and 40 seconds. Then, the second lamp-up step was carried out for 25 minutes. After a temperature was maintained at a maximum temperature of 1200 degrees centigrade for 98 minutes and 53 seconds, the second lamp-down step was carried out for 66 minutes and 40 seconds. Then, the third lamp-up step was carried out for 25 minutes. After a temperature was maintained at a maximum temperature of 1200 degrees centigrade for 98 minutes and 53 seconds, the third lamp-down step was carried out for 133 minutes and 20 seconds.

Figure 8:
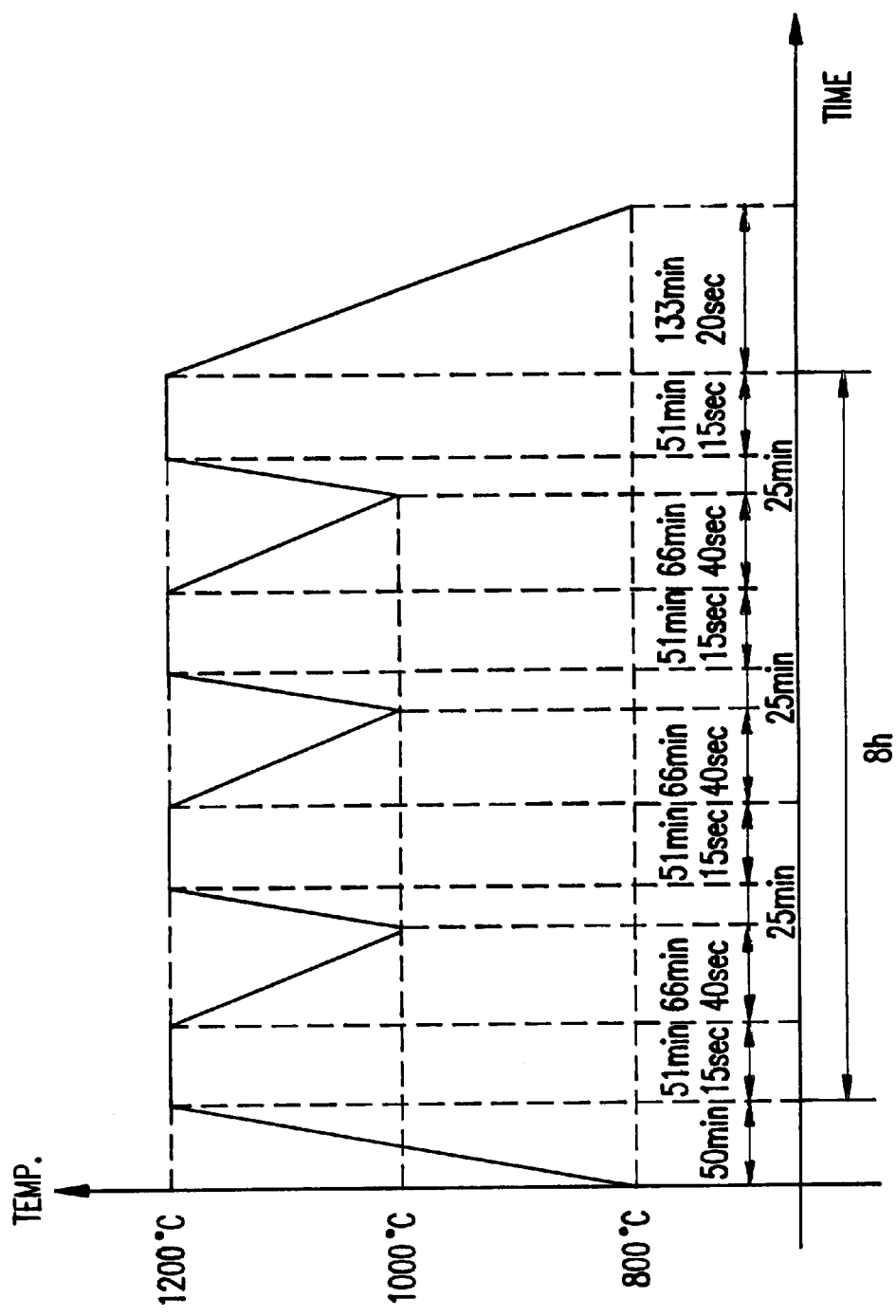
FIG. 8 is a graph illustrating a relation between a temperature in a furnace and lapse of time in heat treatment to be carried out in a method in accordance with the first example of the present invention. In this heat treatment, lamp-up and lamp-down steps are both carried out four times.

FIG. 8 illustrates a temperature varying with the lapse of time in the third heat treatment carried out in accordance with the first example. In the third heat treatment, a lamp-up step was carried out four times, and a lamp-down step was carried out four times, too. The first lamp-up step was carried out for 50 minutes. After a temperature was maintained at a maximum temperature of 1200 degrees centigrade for 51 minutes and 15 seconds, the first lamp-down step was carried out for 66 minutes and 40 seconds. Then, the second lamp-up step was carried out for 25 minutes. After a temperature was maintained at a maximum temperature of 1200 degrees centigrade for 51 minutes and 15 seconds, the second lamp-down step was carried out for 66 minutes and 40 seconds. Then, the third lamp-up step was carried out for 25 minutes. After a temperature was maintained at a maximum temperature of 1200 degrees centigrade for 51 minutes and 15 seconds, the third lamp-down step was carried out for 66 minutes and 40 seconds. Then, the fourth lamp-up step was carried out for 25 minutes. After a temperature was maintained at a maximum temperature of 1200 degrees centigrade for 51 minutes and 15 seconds, the fourth lamp-down step was carried out for 133 minutes and 20 seconds.

In all of the heat treatment illustrated in FIGS. 5 to 8, a temperature in the range of 1000 to 1200 degrees centigrade was kept for 8 hours except both the lamp-up step carried out immediately after introduction of a wafer into a furnace and the lamp-down step carried out immediately before taking a wafer out of a furnace.

Figure 9:
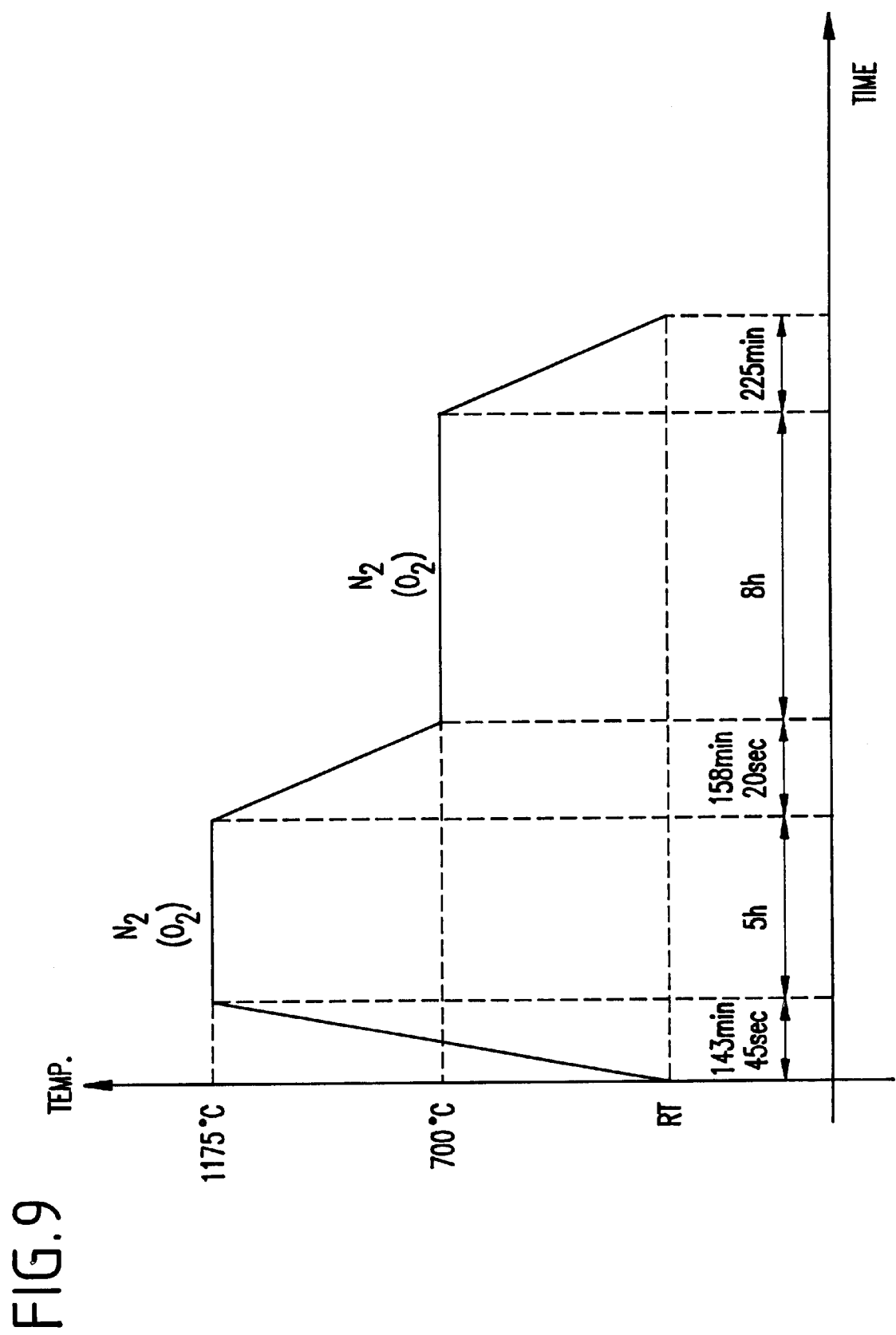
FIG. 9 is a graph illustrating a relation between a temperature in a furnace and lapse of time in heat treatment to be carried out before formation of a well in Cz-Si wafer in a method in accordance with the first example of the present invention.

FIG. 9 is a graph illustrating a relation between a temperature in a furnace and lapse of time in heat treatment carried out before formation of a well in Cz-Si wafer and further before a formation of a gate of a solid-state image sensor in the first example.

As illustrated in FIG. 9, Cz-Si wafer was subject to the lamp-up step for 143 minutes and 45 seconds, and was kept at 1175 degrees centigrade in nitrogen atmosphere for 5 hours. Then, Cz-Si wafer was subject to the lamp-down step for 158 minutes and 20 seconds, and then, was kept at 700 degrees centigrade in nitrogen and oxygen atmosphere for 8 hours. Then, Cz-Si wafer was subject to the second lamp-down step for 225 minutes.

Cz-Si wafer fabricated in such a manner as illustrated in FIG. 9 is called DZ-IG wafer.

There were formed Cz-Si wafer and DZ-IG wafer in accordance with the conventional method illustrated in FIG. 5. Then, a solid-state image sensor is fabricated on each of the thus formed Cz-Si and DZ-IG wafers. Likewise, there were formed Cz-Si wafer and DZ-IG wafer in accordance with the first example, and then, a solid-state image sensor is fabricated on each of the thus formed Cz-Si and DZ-IG wafers.

There was conducted the experiment with respect to the thus fabricated solid-state image sensors, as follows.

Figure 10:
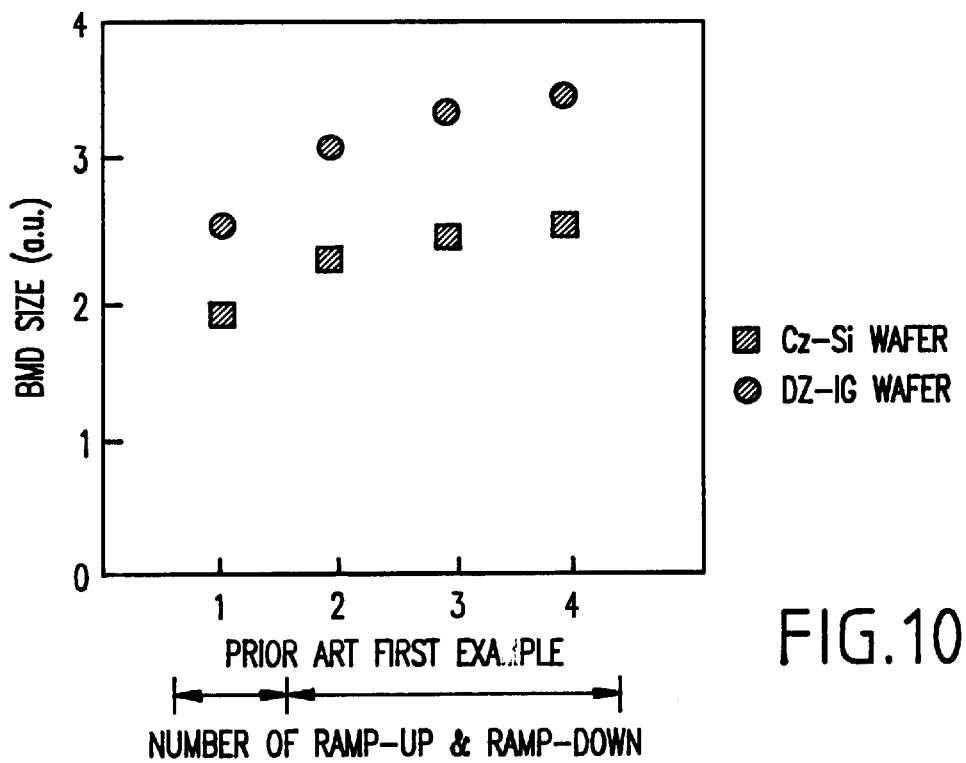
FIG. 10 is a graph showing comparison in a size between BMD having been formed in a wafer in accordance with a conventional method and BMD having been formed in a wafer in accordance with the first example of the invention.

FIG. 10 illustrates distributions of BMD size formed in both Cz-Si wafer and DZ-IG wafer formed in accordance with the conventional method and the first example. BMD size was detected as follows. First, infrared radiation was applied to a wafer. A part of infrared lights passed through the wafer. Since defect such as BMD have an index of refraction which is different from that of Si, the infrared light having passed through the wafer indicates existence of defect. By transferring the infrared lights indicating defect into a current, there was obtained a voltage indicating a size of defect. Thus, BMD size could be detected as the thus obtained voltage.

In FIG. 10, solid squares indicate BMD sizes of Cz-Si wafer, and solid circles indicate BMD size of DZ-IG wafer. Each of BMD sizes is plotted for every one of the numbers of lamp-up and lamp-down steps. BMD sizes associated with the number of 1 (one) is based on the conventional method, whereas BMD sizes associated with the numbers 2 to 4 are based on the first example.

As is obvious in view of FIG. 10, BMD sizes in DZ-IG wafer are greater than BMD sizes in Cz-Si wafer in both the conventional method and the first example.

In addition, a difference in size between BMD in a wafer of a solid-state image sensor fabricated in accordance with the conventional method in which lamp-up and lamp-down steps are carried out each only once, and BMD in a wafer of a solid-state image sensor fabricated in accordance with the first example becomes greater as the number of lamp-up and lamp-down steps becomes greater. BMD having a greater size can facilitate gettering of contaminants to a greater degree.

Figure 11:
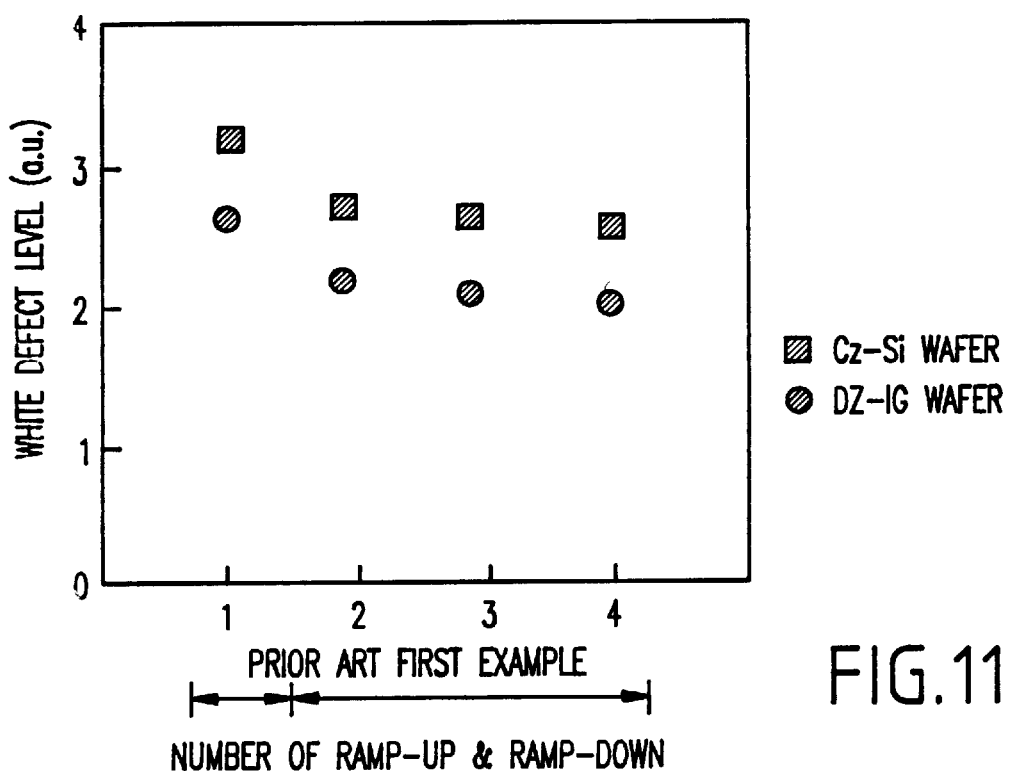
FIG. 11 is a graph showing comparison in a level of illuminated or white defect between a solid-state image sensor fabricated in accordance with a conventional method and a solid-state image sensor fabricated in accordance with the first example of the invention.

FIG. 11 illustrates a level of illuminated or white defect in both solidstate image sensors fabricated in accordance with the conventional method and the first example.

As is obvious in view of FIG. 11, a level of illuminated or white defect in DZ-IG wafer is lower than a level of illuminated or white defect in DZ-IG wafer in both solid-state image sensors fabricated in accordance with the conventional method and the first example. In addition, a level of illuminated or white defect in a solid-state image sensor fabricated in accordance with the first example in which lamp-up and lamp-down steps are carried out twice to four times is lower than a level of illuminated or white defect in a solid-state image sensor fabricated in accordance with the conventional method in which lamp-up and lamp-down steps are carried out each only once.

This is considered because BMD is facilitated to grow in a solid-state image sensor fabricated in accordance with the first example to a greater degree than a solid-state image sensor fabricated in accordance with the conventional method, and hence, contaminants penetrating a wafer while a solid-state image sensor is being fabricated are gettered into BMDs in a greater amount in a solidstate image sensor fabricated in accordance with the first example than in a solid-state image sensor fabricated in accordance with the conventional method, resulting in reduction in a level of illuminated or white defect.

SECOND EMBODIMENT

Figure 12:
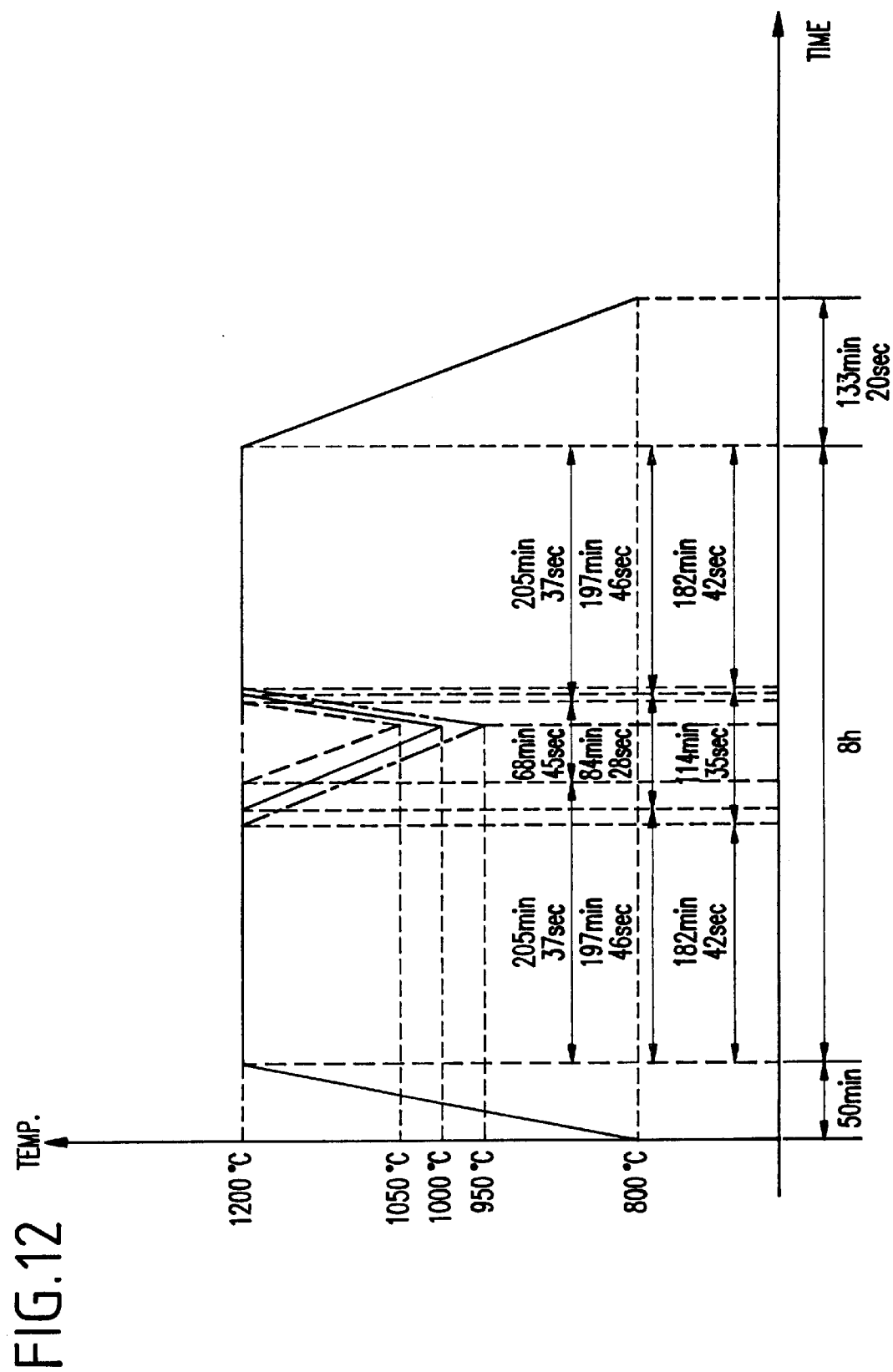
FIG. 12 is a graph illustrating a relation between a temperature and lapse of time in heat treatment to be carried out in the second example in accordance with the present invention.

FIG. 12 is a graph illustrating a relation between a temperature and lapse of time in heat treatment to be carried out in the second example. This heat treatment was carried out before formation of a well and further before formation of a gate of a solid-state image sensor. In this heat treatment, a maximum temperature was set at 1200 degrees centigrade.

As illustrated in FIG. 12, first to third heat treatment were carried out in the second example, similarly to the first example. In each of the first to third heat treatment, lamp-up and lamp-down steps were carried out twice, and a maximum temperature was fixed at 1200 degrees centigrade.

In the first heat treatment, the first lamp-up step was carried out for 50 minutes. After a temperature was maintained at a maximum temperature of 1200 degrees centigrade for 182 minutes and 42 seconds, the first lamp-down step and the second lamp-up step were carried out for 114 minutes and 35 seconds. After a temperature was maintained at a maximum temperature of 1200 degrees centigrade for 182 minutes and 42 seconds, the second lamp-down step was carried out for 133 minutes and 20 seconds.

In the second heat treatment, the first lamp-up step was carried out for 50 minutes. After a temperature was maintained at a maximum temperature of 1200 degrees centigrade for 197 minutes and 46 seconds, the first lamp-down step and the second lamp-up step were carried out for 84 minutes and 28 seconds. After a temperature was maintained at a maximum temperature of 1200 degrees centigrade for 197 minutes and 46 seconds, the second lamp-down step was carried out for 133 minutes and 20 seconds.

In the third heat treatment, the first lamp-up step was carried out for 50 minutes. After a temperature was maintained at a maximum temperature of 1200 degrees centigrade for 205 minutes and 37 seconds, the first lamp-down step and the second lamp-up step were carried out for 68 minutes and 45 seconds. After a temperature was maintained at a maximum temperature of 1200 degrees centigrade for 205 minutes and 37 seconds, the second lamp-down step was carried out for 133 minutes and 20 seconds.

The first to third heat treatment are different from one another in that temperatures just after completion of the first lamp-down step are set at 1050, 1000 and 950 degrees centigrade, respectively.

Similarly to the first example, Cz-Si wafer and DZ-IG wafer were employed in the second example. The first to third heat treatment as illustrated in FIG. 12 were applied to those Cz-Si and DZ-IG wafers to thereby fabricate six solid-state image sensors.

Figure 13:
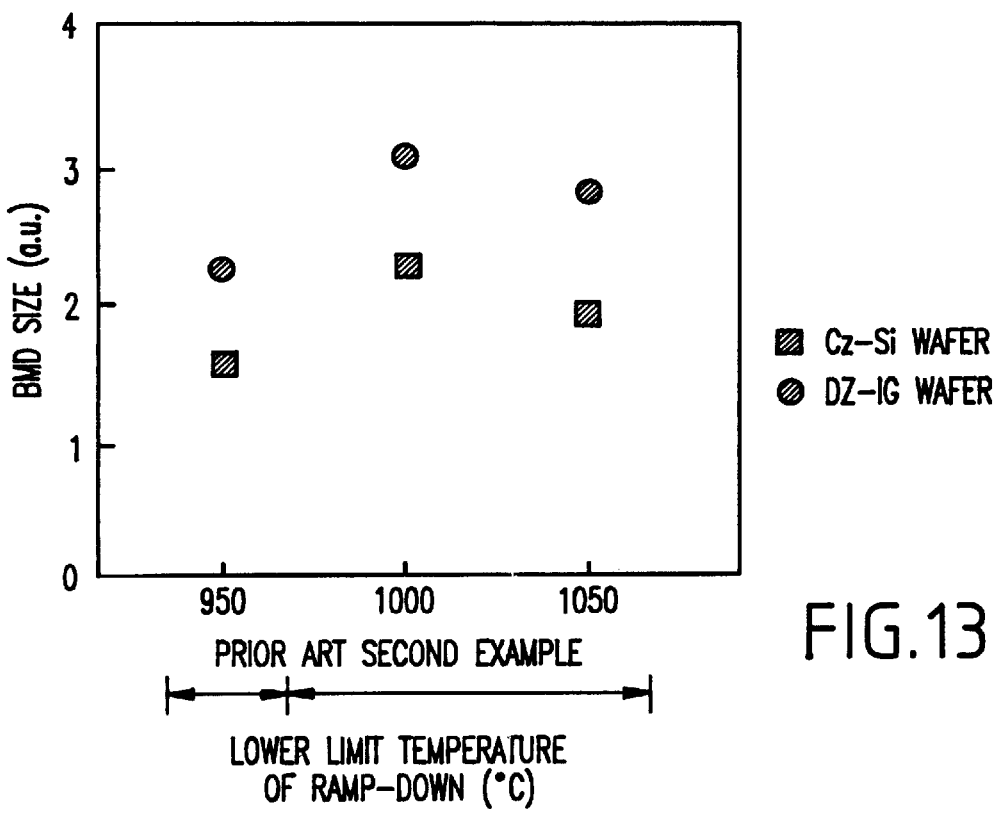
FIG. 13 is a graph showing comparison in a size between BMDs formed in two wafers fabricated in accordance with the second example of the invention.

FIG. 13 illustrates BMD sizes in the above-mentioned Cz-Si and DZ-IG wafers, which BMD sizes were observed just after the solid-state image sensors have been completed. In FIG. 13, solid squares indicate BMD sizes in Cz-Si wafer, and solid circles indicate BMD sizes in DZ-IG wafer. Each of the solid squares and solid circles is plotted for each one of temperatures achieved by the lamp-down steps. The solid square and circle located above a lower limit temperature of 950 degrees centigrade is associated with the conventional method, and the solid squares and circles located above lower limit temperatures of 1000 and 1050 degrees centigrade are associated with the second example.

As is understood in view of FIG. 13, if a furnace temperature reaches 1000 degrees centigrade or higher after completion of the first lamp-down step, BMD sizes would be greater than BMD sizes obtained when a temperature does not reach 1000 degrees centigrade in a lamp-down step, in both Cz-Si and DZ-IG wafers. This shows that the method in accordance with the second example is more suitable for growing BMD than the conventional method.

Figure 14:
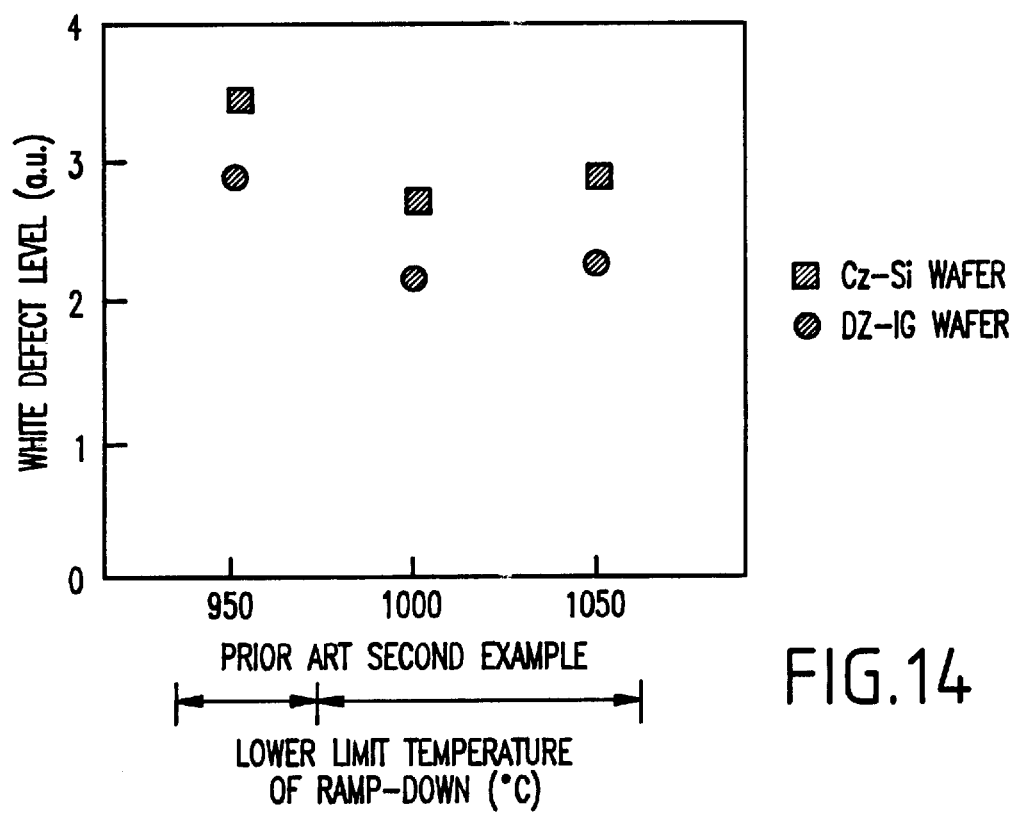
FIG. 14 is a graph showing comparison in a level of illuminated or white defect between solid-state image sensors fabricated in accordance with the second example of the present invention.

FIG. 14 illustrates a level of illuminated or white defect in the solidstate image sensors formed on the above-mentioned Cz-Si and DZ-IG wafers.

As is obvious in view of FIG. 14, if a lower limit temperature in the first lamp-down step reaches 1000 degrees centigrade or higher, a level of illuminated or white level would be lower than a level of illuminated or white level obtained when a lower limit temperature in the first lamp-down step does not reach 1000 degrees centigrade, in both Cz-Si and DZ-IG wafers. This is considered because contaminants are gettered into BMDs in a greater amount in association with the results shown in FIG. 13, resulting in reduction in a level of illuminated or white defect.

Figure 15:
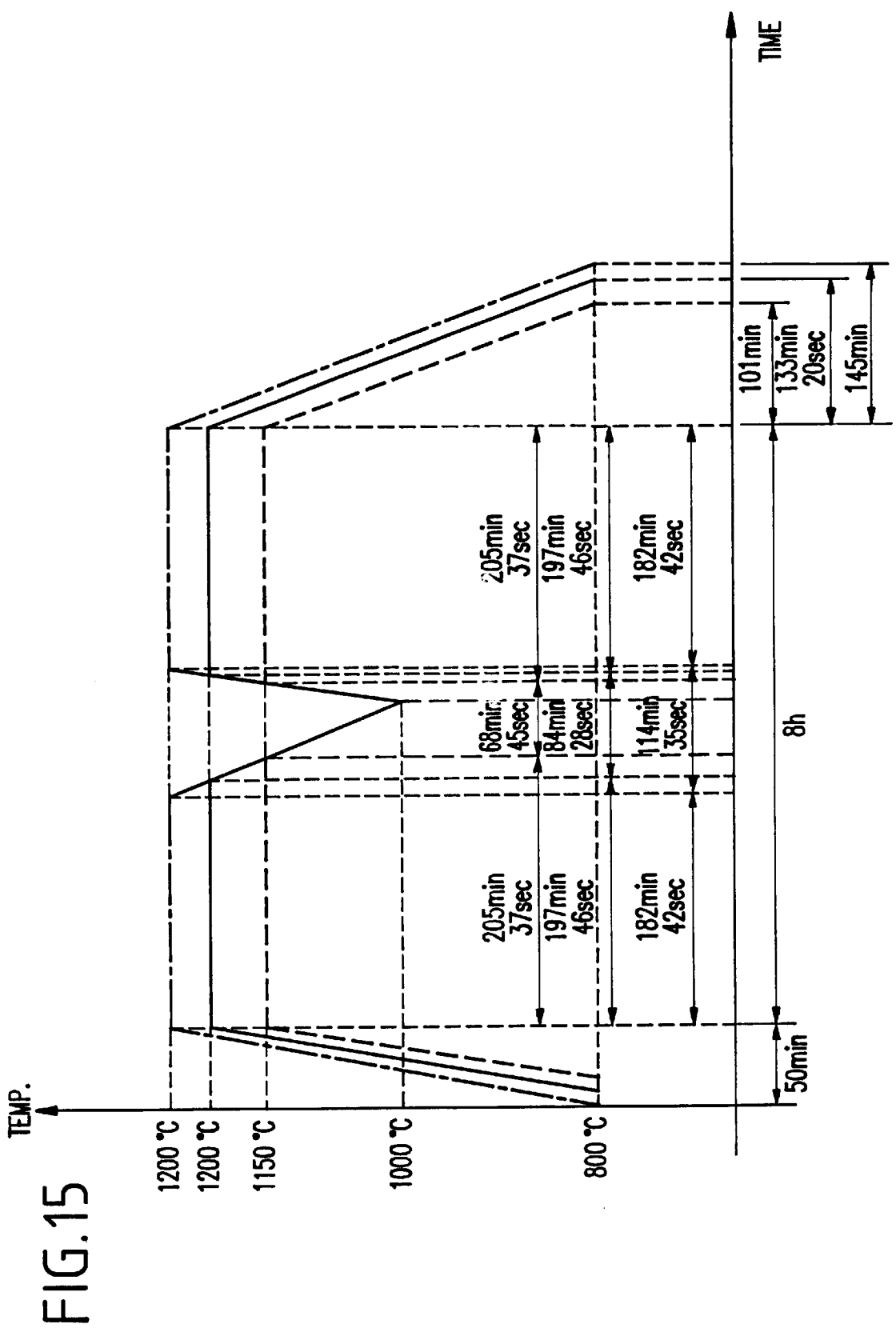
FIG. 15 is a graph illustrating a relation between a temperature and lapse of time in heat treatments to be carried out in the second example in accordance with the present invention. In these heat treatments, maximum temperatures before formation of a well are 1150, 1200 and 1250 degrees centigrade.

FIG. 15 is a graph illustrating a relation between a temperature and lapse of time in another first to third heat treatment to be carried out in the second example. These heat treatment were carried out before formation of a well and further before formation of a gate of a solid-state image sensor. In the first to third heat treatment, maximum temperatures were set at 1150, 1200 and 1250 degrees centigrade, respectively, and lamp-up and lamp-down steps were carried out twice.

In the first heat treatment, the first lamp-up step was carried out for 50 minutes. After a temperature was maintained at a maximum temperature of 1150 degrees centigrade for 182 minutes and 42 seconds, the first lamp-down step and the second lamp-up step were carried out for 114 minutes and 35 seconds. After a temperature was maintained at a maximum temperature of 1150 degrees centigrade for 182 minutes and 42 seconds, the second lamp-down step was carried out for 101 minutes.

In the second heat treatment, the first lamp-up step was carried out for 50 minutes. After a temperature was maintained at a maximum temperature of 1200 degrees centigrade for 197 minutes and 46 seconds, the first lamp-down step and the second lamp-up step were carried out for 84 minutes and 28 seconds. After a temperature was maintained at a maximum temperature of 1200 degrees centigrade for 197 minutes and 46 seconds, the second lamp-down step was carried out for 133 minutes and 20 seconds.

In the third heat treatment, the first lamp-up step was carried out for 50 minutes. After a temperature was maintained at a maximum temperature of 1250 degrees centigrade for 205 minutes and 37 seconds, the first lamp-down step and the second lamp-up step were carried out for 68 minutes and 45 seconds. After a temperature was maintained at a maximum temperature of 1250 degrees centigrade for 205 minutes and 37 seconds, the second lamp-down step was carried out for 145 minutes.

The first to third heat treatment illustrated in FIG. 15 were carried out before formation of a gate of a solid-state image sensor, similarly to the first example. In each of the first to third heat treatment, lamp-up and lamp-down steps were carried out twice, and a temperature was fixed at 1000 degrees centigrade when the first lamp-down step was completed. The heat treatment illustrated in FIG. 15 is different from the heat treatment illustrated in FIG. 12 in that the maximum temperatures were different from one another in the first to third heat treatment. Namely, the maximum temperature was fixed at 1200 degrees centigrade in the first to third heat treatment illustrated in FIG. 12, whereas the maximum temperatures were fixed at 1150, 1200 and 1250 degrees centigrade in the first to third heat treatment illustrated in FIG. 15, respectively.

Similarly to the first example, Cz-Si wafer and DZ-IG wafer were employed in the heat treatment illustrated in FIG. 15. The first to third heat treatment as illustrated in FIG. 15 were applied to those Cz-Si and DZ-IG wafers to thereby fabricate six solid-state image sensors.

Figure 16:
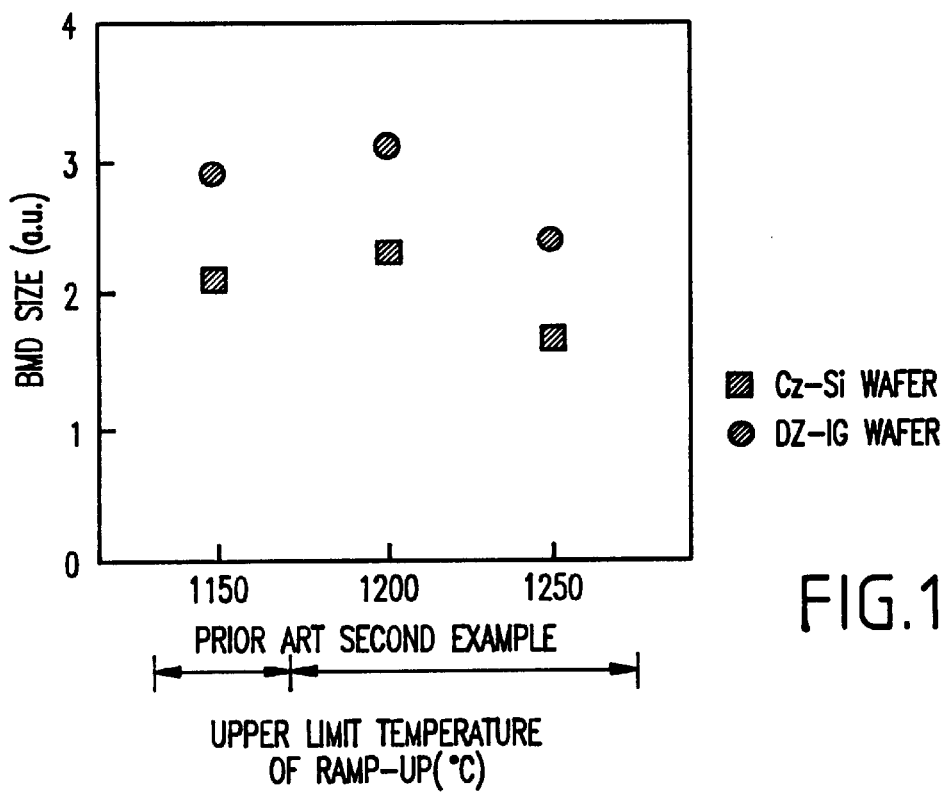
FIG. 16 is a graph showing comparison in a size between BMDs formed in two wafers fabricated in accordance with the second example of the invention.

FIG. 16 illustrates BMD sizes in the above-mentioned Cz-Si and DZ-IG wafers, which BMD sizes were observed just after the solid-state image sensors have been completed. In FIG. 16, solid squares indicate BMD sizes in Cz-Si wafer, and solid circles indicate BMD sizes in DZ-IG wafer. Each of the solid squares and solid circles is plotted for each one of upper limit temperatures achieved by the lamp-up steps. The solid square and circle located above an upper limit temperature of 1150 degrees centigrade is associated with the conventional method, and the solid squares and circles located above upper limit temperatures of 1200 and 1250 degrees centigrade are associated with the second example.

As is understood in view of FIG. 16, if a furnace temperature reaches 1200 degrees centigrade or lower after completion of the first lamp-up step, BMD sizes would be greater than BMD sizes obtained when a temperature reaches 1200 degrees centigrade or higher in a lamp-up step, in both Cz-Si and DZ-IG wafers. This shows that the method in accordance with the second example is more suitable for growing BMD than the conventional method.

Figure 17:
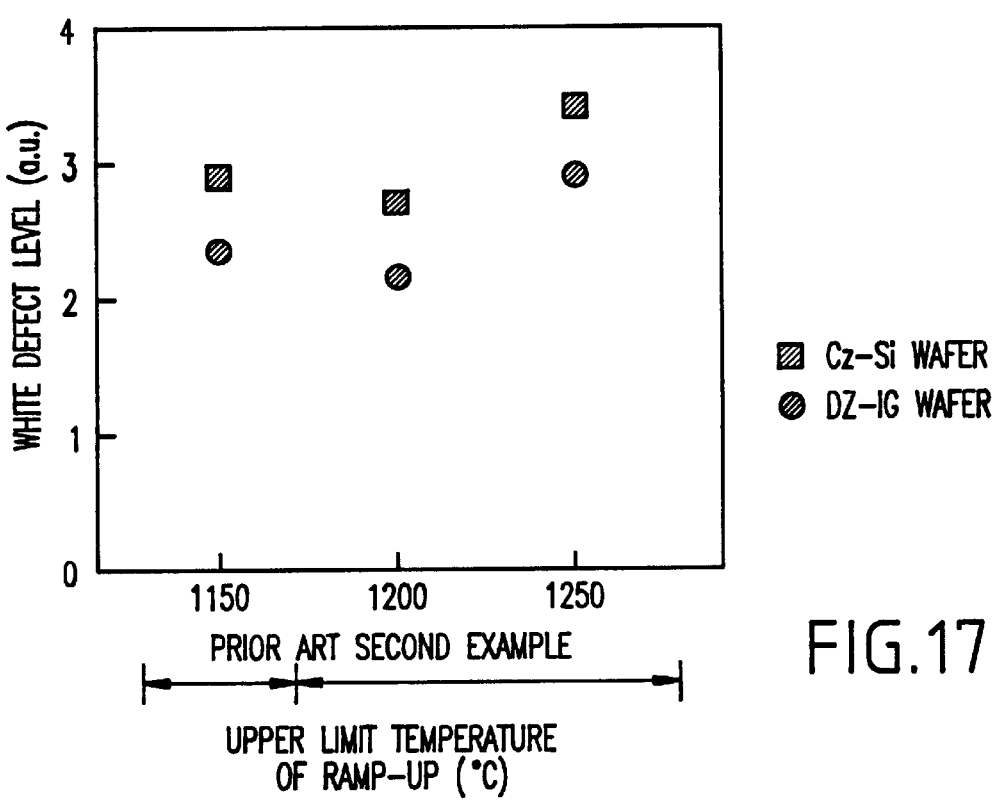
FIG. 17 is a graph showing comparison in a level of illuminated or white defect between solid-state image sensors fabricated in accordance with the second example of the present invention.

FIG. 17 illustrates a level of illuminated or white defect in a solid-state image sensors formed on the above-mentioned Cz-Si and DZ-IG wafers.

As is obvious in view of FIG. 17, if an upper limit temperature in the lamp-up step does not reach 1200 degrees centigrade, a level of illuminated or white level would be lower than a level of illuminated or white level obtained when an upper limit temperature in the lamp-down step reaches 1200 degrees centigrade or higher, in both Cz-Si and DZ-IG wafers. This is considered because contaminants are gettered into BMDs in a greater amount in association with the results shown in FIG. 16, resulting in reduction in a level of illuminated or white defect.

THIRD EXAMPLE

A relation between a temperature and the lapse of time in the heat treatment carried out in the third example is the same as the relation illustrated in FIGS. 5 and 8. The heat treatment in the third example was carried out before formation of a gate of a solid-state image sensor and further before formation of a well. A maximum temperature was set at 1200 degrees centigrade in the third example.

In the third example, Cz-Si wafer and DZ-IG wafer were employed, similarly to the second example. A first solid-state image sensor A was fabricated in each of the Cz-Si and DZ-IG wafers, and similarly, a second solid-state image sensor B was fabricated in each of the Cz-Si and DZ-IG wafers.

Similarly to the above-mentioned first and second examples, the heat treatment as illustrated in FIGS. 5 and 8 were applied to the Cz-Si and DZ-IG wafers as heat treatment to be carried out before formation of a gate of a solidstate image sensor.

Figure 18:
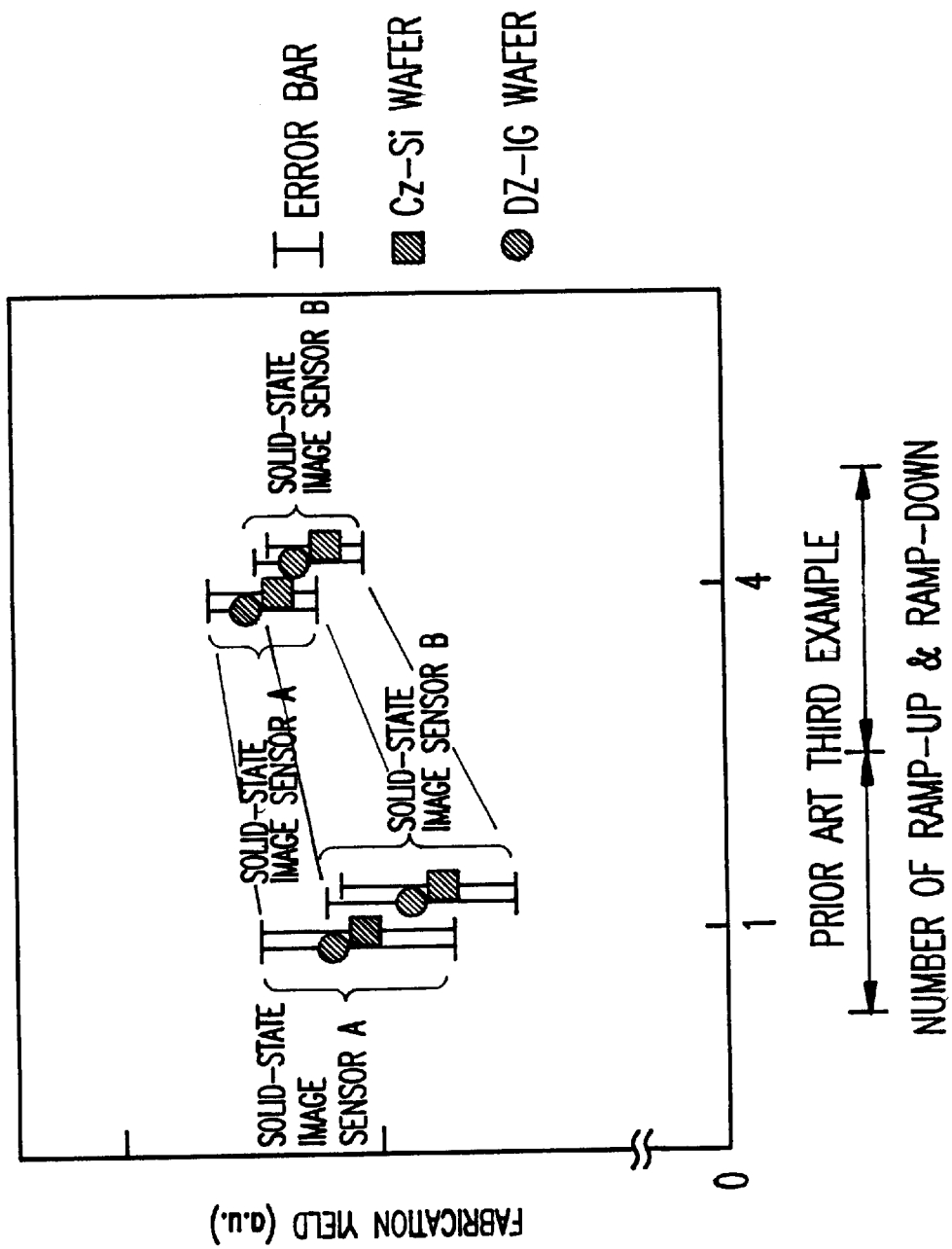
FIG. 18 is a graph illustrating fabrication yields of solid-state image sensors A and B fabricated in accordance with the third example of the present invention.

FIG. 18 illustrates fabrication yields of the thus fabricated first and second solid-state image sensors A and B. In FIG. 18, solid squares indicate fabrication yields of the solid-state image sensors formed on the Cz-Si wafer, and solid circles indicate fabrication yields of the solid-state image sensors formed on the DZ-IG wafer. Each of the solid squares and circles is plotted for each one of the numbers of the lamp-up and lamp-down steps. The solid squares and circles located above the number 1 are associated with the conventional method, and the solid squares and circles located above the number 4 are associated with the third example.

As is understood in view of FIG. 18, a fabrication yield of the solid-state image sensors formed on the DZ-IG wafer is higher than a fabrication yield of the solid-state image sensors formed on the Cz-Si wafer, regardless of the number of the lamp-up and lamp-down steps. In addition, a fabrication yield is higher in the greater number of the lamp-up and lamp-down steps. That is, dispersion in a fabrication yield of solid-state image sensors fabricated in accordance with the third example where the lamp-up and lamp-down steps are carried out each four times is smaller than dispersion in a fabrication yield of solid-state image sensors fabricated in accordance with the conventional method where the lamp-up and lamp-down steps are carried out each only once.

The reason for this is as follows. In the third example, at least two lamp-up steps and at least two lamp-down steps are carried out in heat treatment having a maximum temperature of 1200 degrees, before formation of a gate of a solid-state image sensor. Those lamp-up and lamp-down steps are carried out in a temperature band optimal for BMD growth by the same number and for almost the same period of time for every one of solid-state image sensors. As a result, there is no dispersion in a fabrication yield of solid-state image sensors.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-88612 filed on Apr. 1, 1998 including specification, claims, drawings and summary is incorporated herein by reference in its entirety.

What is claimed is:

1. A method of fabricating a solid-state image sensor, comprising:

carrying out heat treatment before formation of a gate of said solid-state image sensor, a maximum temperature in said heat treatment being in the range of 1000–1200° centigrade both inclusive, said carrying out heat treatment further including
(a) carrying out a lamp-up process at least twice, and
(b) carrying out a lamp-down process at least twice.

2. The method as set forth in claim 1, wherein a temperature in the first lamp-up process is in the range of 1000 to 1200 degrees centigrade both inclusive, and the second or later lamp-up process has an upper limit temperature of 1200 degrees centigrade.

3. The method as set forth in claim 1, wherein a lamp-down process to be carried out after a lamp-up process has a lower limit temperature of 1000 degrees centigrade.

4. The method as set forth in claim 1, wherein temperatures achieved in said lamp-up processes are different from each other.

5. The method as set forth in claim 1, wherein temperatures achieved in said lamp-down processes are different from each other.

6. The method as set forth in claim 1, wherein a lamp-up rate in said lamp-up processes is in the range of 8 to 200 degrees per minute.

7. The method as set forth in claim 1, wherein a lamp-down rate in said lamp-down processes is in the range of 3 to 100 degrees per minute.

8. The method as set forth in claim 1, wherein the number of said lamp-up processes is the same as the number of said lamp-down processes.

9. A method of fabricating a solid-state image sensor, comprising:

carrying out first heat treatment at a temperature in the range of 1150 to 1200 degrees centigrade both inclusive; and carrying out second heat treatment at a temperature in the range of 500 to 800 degrees centigrade both inclusive, said first and second heat treatments both being to be carried out before formation of a gate of said solid-state image sensor, at least two lamp-up processes and at least two lamp-down processes being carried out while said first and second heat treatment are carried out.

10. The method as set forth in claim 9, wherein a temperature in the first lamp-up process is in the range of 1000 to 1200 degrees centigrade both inclusive, and the second or later lamp-up process has an upper limit temperature of 1200 degrees centigrade.

11. The method as set forth in claim 9, wherein a lamp-down process to be carried out after a lamp-up process has a lower limit temperature of 1000 degrees centigrade.

12. The method as set forth in claim 9, wherein temperatures achieved in said lamp-up processes are different from each other.

13. The method as set forth in claim 9, wherein temperatures achieved in said lamp-down processes are different from each other.

14. The method as set forth in claim 9, wherein a lamp-up rate in said lamp-up processes is in the range of 8 to 200 degrees per minute.

15. The method as set forth in claim 9, wherein a lamp-down rate in said lamp-down processes is in the range of 3 to 100 degrees per minute.

16. The method as set forth in claim 9, wherein the number of said lamp-up processes is the same as the number of said lamp-down processes.

17. A method of fabricating a solid state image sensor, comprising:

(a) forming an epitaxial layer on a substrate; and
(b) fabricating a solid-state image senor on said epitaxial layer, said fabricating of said solid-state image sensor including carrying out heat treatment before formation of a gate of said solid-state image sensor, a maximum temperature in said heat treatment being in the range of 1000 to 1200 degrees centigrade both inclusive, said carrying out heat treatment further including carrying out a lamp-up process at least twice, and carrying out a lamp-down process at least twice.

18. The method as set forth in claim 17, wherein a temperature in the first lamp-up process is in the range of 1000 to 1200 degrees centigrade both inclusive, and the second or later lamp-up process has an upper limit temperature of 1200 degrees centigrade.

19. The method as set forth in claim 17, wherein a lamp-down process to be carried out after a lamp-up process has a lower limit temperature of 1000 degrees centigrade.

20. The method as set forth in claim 17, wherein temperatures achieved in said lamp-up processes are different from each other.

21. The method as set forth in claim 17, wherein temperatures achieved in said lamp-down processes are different from each other.

22. The method as set forth in claim 17, wherein a lamp-up rate in said lamp-up processes is in the range of 8 to 200 degrees per minute.

23. The method as set forth in claim 17, wherein a lamp-down rate in said lamp-down processes is in the range of 3 to 100 degrees per minute.

24. The method as set forth in claim 17, wherein the number of said lamp-up processes is the same as the number of said lamp-down processes.

25. The method as set forth in claim 17, wherein said heat treatment is comprised of a first heat treatment to be carried out at a temperature in the range of 1150 to 1200 degrees centigrade both inclusive, and a second heat treatment to be carried out at a temperature in the range of 500 to 800 degrees centigrade both inclusive.

* * * * *

UNITED STATES PATENT AND TRADEMARK OFFICE
CERTIFICATE OF CORRECTION

PATENT NO. : 6,261,860 B1
DATED : July 17, 2001
INVENTOR(S) : Tsuyoshi Nagata

It is certified that error appears in the above-identified patent and that said Letters Patent is hereby corrected as shown below:

Title page,
Item [57], ABSTRACT,
Line 7, change "lamp-up" to -- ramp-up --.
Line 8, change "lamp-down" to -- ramp-down --.

Column 2,
Lines 54, 63 and 66, change "lamp-up" to -- ramp-up --.
Lines 55 and 64, "lamp-down" to -- ramp-down --.

Column 3,
Lines 1, 4, 6, 8, 18, 20, 22, 30 and 44, change "lamp-up" to -- ramp-up --.
Lines 3, 9, 19, 21, 23, 30 and 44, change "lamp-down" to -- ramp-down --.
Line 12, change "lamp-" to -- ramp- --.
Lines 14 and 16, change "lamp-down" (first and second occurrence) to -- ramp-down --.

Column 4,
Lines 19, 26, 31 and 37, change "lamp-up" to -- ramp-up -- and change "lamp-down" to -- ramp-down --.

Column 5,
Lines 25, 37, and 58, change "lamp-up" to -- ramp-up -- and change "lamp-down" to -- ramp-down --.
Lines 27, 39, 41, 46 and 48, change "lamp-up" to -- ramp-up --.
Lines 30, 31, 50 and 52, change "lamp-down" to -- ramp-down --.
Line 42, change "lamp-down" to -- ramp-down -- and change "lamp-up" to -- ramp-up --.
Line 55, change "lamp-" to -- ramp- --.

Column 6,
Lines 19 and 57, change "lamp-up" to -- ramp-up --.
Lines 20 and 58, change "lamp-down" to -- ramp-down --.
Line 43, delete "lamping" and insert -- ramping --.
Lines 62 and 65, change "lamp-up" to -- ramp-up -- and change "lamp-down" to -- ramp-down --.

Column 7,
Lines 25 and 53, change "lamp-up" to -- ramp-up -- and change "lamp-down" to -- ramp-down --.
Lines 30, 32, 39, 41, 45, 54, 59 and 63, change "lamp-up" to -- ramp-up --.
Lines 31, 35, 40, 44, 62 and 66, change "lamp-down" to -- ramp-down --.
Lines 48 and 57, change "lamp-" to -- ramp- --.

UNITED STATES PATENT AND TRADEMARK OFFICE
CERTIFICATE OF CORRECTION

PATENT NO. : 6,261,860 B1
DATED : July 17, 2001
INVENTOR(S) : Tsuyoshi Nagata

It is certified that error appears in the above-identified patent and that said Letters Patent is hereby corrected as shown below:

Column 8,
Lines 3, 5, 10, 14, 19, 26 and 36, change "lamp-up" to -- ramp-up --.
Lines 4, 8, 13, 17, 22, 28 and 39, change "lamp-down" to -- ramp-down --.
Line 42, change "lamp-" to -- ramp- --.

Column 9,
Lines 4, 13, 30 and 33, change "lamp-up" to -- ramp-up -- and change "lamp-down" to -- ramp-down --.
Lines 16, 56, 59 and 63, change "lamp-up" to -- ramp-up --.
Lines 17, 57, 62 and 66, change "lamp-down" to -- ramp-down --.

Column 10,
Lines 1, 5, 10 and 14, change "lamp-up" to -- ramp-up --.
Lines 4, 8, 13, 17, 21, 43, 45, 53 and 57, change "lamp-down" to -- ramp-down --.

Column 11,
Lines 2 and 35, change "lamp-up" to -- ramp-up -- and change "lamp-down" to -- ramp-down --.
Lines 4, 8, 13, 17, 22, 26, 58 and 66, change "lamp-up" to -- ramp-up --.
Lines 7, 11, 16, 20, 25, 29 and 37, change "lamp-down" to -- ramp-down --.

Column 12,
Lines 1, 9, 45 and 55, change "lamp-up" to -- ramp-up --.
Lines 12, 46 and 56, change "lamp-down" to -- ramp-down --.
Lines 54, 58, 62 and 65, change "lamp-up" to -- ramp-up -- and change "lamp-down" to -- ramp-down --.

Column 13,
Lines 1 and 47, change "lamp-up" to -- ramp-up -- and change "lamp-down" to -- ramp-down --.
Lines 27, 30, 32, 35, 38, 43, 44, 50 and 67, change "lamp-up" to -- ramp-up --.
Lines 28, 41 and 51, change "lamp-down" to -- ramp-down --.
Lines 34 and 46, change "lamp-" to -- ramp- --.
Line 63, change "lamp-up" to -- ramp-up -- and change "lamp-" to -- ramp- --.

UNITED STATES PATENT AND TRADEMARK OFFICE
CERTIFICATE OF CORRECTION

PATENT NO.    : 6,261,860 B1
DATED         : July 17, 2001
INVENTOR(S)   : Tsuyoshi Nagata It is certified that error appears in the above-identified patent and that said Letters Patent is hereby corrected as shown below:

<u>Column 14,</u>
Lines 2, 5, 8, 21, 34, 37, 42, 46, 52 and 58, change "lamp-up" to -- ramp-up --.
Lines 5, 11, 22, 35, 42, 49, 55 and 59, change "lamp-down" to -- ramp-down --.
Line 15, change "lamp-up" to -- ramp-up -- and change "lamp-" to -- ramp- --.
Line 18, change "lamp-down" (both occurrences) to -- ramp-down --.

Signed and Sealed this

Ninth Day of July, 2002

Attest:

JAMES E. ROGAN
*Attesting Officer*    *Director of the United States Patent and Trademark Office*